(12) United States Patent
Ranjan et al.

(10) Patent No.: US 7,869,266 B2
(45) Date of Patent: Jan. 11, 2011

(54) LOW CURRENT SWITCHING MAGNETIC TUNNEL JUNCTION DESIGN FOR MAGNETIC MEMORY USING DOMAIN WALL MOTION

(75) Inventors: Rajiv Yadav Ranjan, San Jose, CA (US); Roger Klas Malmhall, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 242 days.

(21) Appl. No.: 12/255,624

(22) Filed: Oct. 21, 2008

(65) Prior Publication Data

US 2009/0109739 A1 Apr. 30, 2009

Related U.S. Application Data

(60) Provisional application No. 61/001,348, filed on Oct. 31, 2007, provisional application No. 61/045,582, filed on Apr. 16, 2008.

(51) Int. Cl.
*G11C 11/00* (2006.01)
*G11C 11/14* (2006.01)

(52) U.S. Cl. .................. 365/158; 365/157; 365/171

(58) Field of Classification Search ............... 365/157, 365/158
See application file for complete search history.

(56) References Cited

U.S. PATENT DOCUMENTS

| | | | |
|---|---|---|---|
| 3,665,264 A | 5/1972 | Yukami et al. | |
| 5,060,098 A | 10/1991 | Gotoh et al. | |
| 6,072,718 A | 6/2000 | Abraham et al. | |
| 6,169,689 B1 | 1/2001 | Naji | |
| 6,642,595 B1 | 11/2003 | Hung et al. | |
| 6,670,660 B2 | 12/2003 | Hosotani | |

(Continued)

FOREIGN PATENT DOCUMENTS

JP 2006295198 10/2006

(Continued)

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner*—Ly D Pham
(74) *Attorney, Agent, or Firm*—Maryam Imam; IPxLaw Group LLP

(57) ABSTRACT

A multi-state low-current-switching magnetic memory element (magnetic memory element) comprising a free layer, two stacks, and a magnetic tunneling junction is disclosed. The stacks and magnetic tunneling junction are disposed upon surfaces of the free layer, with the magnetic tunneling junction located between the stacks. The stacks pin magnetic domains within the free layer, creating a free layer domain wall. A current passed from stack to stack pushes the domain wall, repositioning the domain wall within the free layer. The position of the domain wall relative to the magnetic tunnel junction corresponds to a unique resistance value, and passing current from a stack to the magnetic tunnel junction reads the magnetic memory element's resistance. Thus, unique memory states may be achieved by moving the domain wall.

6 Claims, 13 Drawing Sheets

U.S. PATENT DOCUMENTS

| | | | |
|---|---|---|---|
| 6,697,294 | B1 | 2/2004 | Qi et al. |
| 6,724,585 | B2 | 4/2004 | Hayashi |
| 6,905,578 | B1 | 6/2005 | Moslehi et al. |
| 6,985,385 | B2 | 1/2006 | Nguyen et al. |
| 7,002,781 | B2 | 2/2006 | Sugawara |
| 7,023,725 | B2 | 4/2006 | Saito et al. |
| 7,109,539 | B2 | 9/2006 | Lu |
| 2002/0048128 | A1 | 4/2002 | Kamiguchi et al. |
| 2003/0108776 | A1 | 6/2003 | Chang et al. |
| 2003/0123200 | A1 | 7/2003 | Nagasaka et al. |
| 2003/0128483 | A1 | 7/2003 | Kamijo |
| 2003/0232223 | A1 | 12/2003 | Leddy et al. |
| 2004/0042128 | A1 | 3/2004 | Slaughter et al. |
| 2004/0170055 | A1 | 9/2004 | Albert et al. |
| 2004/0201070 | A1 | 10/2004 | Deak |
| 2005/0045913 | A1 | 3/2005 | Nguyen et al. |
| 2005/0063222 | A1 | 3/2005 | Huai et al. |
| 2005/0105325 | A1 | 5/2005 | Haneda et al. |
| 2005/0167657 | A1 | 8/2005 | Nickel et al. |
| 2005/0195532 | A1 | 9/2005 | Sugiyama et al. |
| 2005/0201020 | A1 | 9/2005 | Fuke et al. |
| 2005/0207219 | A1 | 9/2005 | Lee et al. |
| 2005/0254287 | A1 | 11/2005 | Valet et al. |
| 2006/0017081 | A1 | 1/2006 | Sun et al. |
| 2006/0081953 | A1 | 4/2006 | Nguyen et al. |
| 2006/0083056 | A1 | 4/2006 | Daughton et al. |
| 2006/0109591 | A1 | 5/2006 | Ranjan et al. |
| 2006/0114620 | A1 | 6/2006 | Sbiaa et al. |
| 2006/0141640 | A1 | 6/2006 | Huai et al. |
| 2006/0239066 | A1 | 10/2006 | Liaw |
| 2007/0007609 | A1 | 1/2007 | Saito et al. |
| 2007/0164336 | A1 | 7/2007 | Saito et al. |

FOREIGN PATENT DOCUMENTS

| | | |
|---|---|---|
| JP | 2007073971 | 3/2007 |

OTHER PUBLICATIONS

Yingfan, Xu et al.; In situ ordering of FePt thin films with face-centered-tetragonal 001 texture on Cr100ÅxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity;, vol. 42, No. 10, Oct. 2006.

C. J. Sun, et al.; Epitaxial L1o FePt magnetic thin films sputtered on Cu (001); Applied Physics Letters; vol. 82, No. 12, Mar. 24, 2003.

J. A. Katine et al.; Current-Driven Magnetization Reversal and Spin-Wave Excitations in CoCuCo Pillars; Physical Review Letters; vol. 84; Apr. 3, 2000.

LOW CURRENT SWITCHING MAGNETIC TUNNEL JUNCTION DESIGN FOR MAGNETIC MEMORY USING DOMAIN WALL MOTION

CROSS REFERENCE TO RELATED APPLICATIONS

This application claims benefit of U.S. Provisional Patent Application, entitled "Low Current Switching Magnetic Tunnel Junction Design for Magnetic Memory using Domain Wall Motion," U.S. Provisional Application No. 61/001,348, filed on Oct. 31, 2007, and from U.S. patent application Ser. No. 11/674,124, entitled "Non-Uniform Switching Based Non-Volatile Magnetic Base Memory," filed Feb. 12, 2007, by Ranjan, et al., U.S. patent application Ser. No. 11/678,515, entitled "A High Capacity Low Cost Multi-State Magnetic Memory," filed Aug. 23, 2008, by Ranjan, et al., U.S. patent application Ser. No. 11/776,692, entitled "Non-Volatile Magnetic Memory Element with Graded Layer," filed Jul. 12, 2007, by Ranjan, et al., U.S. patent application Ser. No. 11/740,861, entitled "High Capacity Low Cost Multi-Stacked Cross-Line Magnetic Memory," filed Apr. 26, 2007, by Ranjan, et al., and U.S. Provisional Patent Application No. 61/045,582, entitled "Low Power Non-Volatile Magnetic Memory Design," filed Apr. 16, 2008, by Ranjan, et al.

BACKGROUND OF THE INVENTION

1. Field of the Invention

The present invention relates to a novel low-current multi-state current-switching magnetic memory, and, more specifically, to a magnetic memory element employing the torque generated by the polarized spins of electrons to move a free layer domain wall relative to a magnetic tunnel junction.

2. Description of the Prior Art

Computers conventionally use rotating magnetic media for data storage in the form of magnetic hard disk drives (HDDs). Though widely used and commonly accepted, such hard disk drives suffer from a variety of deficiencies. Access latency, higher power dissipation, increased physical size and inability to withstand any physical shock justifies a new type of storage device. Other dominant semiconductor based storage devices are DRAM and SRAM which are volatile and very costly, but have faster random read/write time. Solid-state-nonvolatile-memory (SSNVM) devices like NOR/NAND flash memory provide higher access time, higher IOP speed, lower power dissipation, smaller physical size, and higher reliability, but at a cost which tends to be generally multiple times higher than HDDs.

Although NAND flash memory is more costly, it has replaced HDDs in many applications such as digital cameras, MP3 players, cell phones, and hand held multimedia devices. However, as process geometry is getting smaller, the design of NAND flash memory and DRAM memory is becoming more difficult to scale. For example, NAND flash memory has issues related to capacitive coupling, few electrons/bit, poor error-rate performance, and poor reliability due to low read-write endurance. It is believed that NAND flash memory, especially multi-bit designs will be extremely difficult to scale below 45 nm-lithography. Likewise, DRAM has issues related to scaling trench capacitors, necessitating complex designs that are becoming difficult to manufacture, and leading to higher costs.

Currently many platforms use combinations of EEPROM/NOR, NAND, HDDs, and DRAM as a part of the system design. Use of multiple memory technologies in a single product will add to the design complexity, time to market, and the final cost. For example, a handheld multi-media device which incorporates NAND Flash, DRAM, and EEPROM/NOR flash will have additional levels of design complexity, cost more, and take longer to reach the market than a device incorporating fewer unique memory technologies. Also, incorporating multiple memory technologies increases the device's footprint, an undesirable property for a handheld device.

There has also been extensive effort in development of alternative technologies such as Ovanic RAM (or phase-change memory), Ferro-electric RAM (FeRAM), Magnetic RAM (MRAM), nanochip, and others, to replace memories used in current designs. Although these various memory/storage technologies have created many challenges, there have been great advances made in this field in recent years. Magnetic-random-access-memory (MRAM) seems to lead as the best candidate to replace all types of memories as a universal memory solution. Recently, low capacity MRAM, which relies on a magnetic field to switch the memory elements, started shipping. Numerous scientific papers have shown that direct electrical current can also be used to switch the memory elements. There is a tradeoff between low-switching current, and reliability of the memory associated due to thermal stability.

The current-switching tradeoff arises due to the interaction between magnetic moments and the electrical transport current. At least two dominant mechanisms have been proposed, namely, (1) current induced magnetic field and, (2) spin-torque from the current spin polarization. While the current induced effect through the magnetic field is directly proportion to radius (r), the later spin-torque effect is proportional to $r^2$, where r is the distance from the center of current carrying device. Incidentally, the torque generated by spins through the momentum transfer of tunneled polarized spins from the fixed layer, which opposes the "intrinsic" damping of spins of the free-layer. At sufficient current this can reverse the direction of the magnetization in the free layer. The critical current required for such switching:

$$Ic = Ic_0\left[1 - \left(\frac{k_b T}{K_u V}\right)\ln\left(\frac{t_p}{t_0}\right)\right]. \qquad \text{Equation 1}$$

Where $Ic_0$ is the critical switching current density without thermal fluctuation; $k_b$ is the Boltzman constant; T is the temperature; $K_u$ is the effective uniaxial anisotropy; V is the volume of the free-layer; $t_0$ is the inverse of the procession frequency of the spin (less than 1 ns); $t_p$ is the pulse width of the switching current.

Equation 1 shows that one way to reduce the critical switching current density is by reducing either Ku or V of the free-layer. Secondly, the switching current can be reduced by utilizing a thinner free-layer, but this may compromise reliability by making the memory cell thermally unstable. A memory element with a free-layer having a higher $K_u V$ is more thermally stable at higher temperatures. A general rule of thumb is that the magnetic energy, $K_u V$, of the free-layer be greater than about $80 k_b T$ where, $k_b$ is the Boltzmann constant and T is the ambient temperature.

What is needed is a novel memory that has high tunneling magneto-resistance (TMR) while having flexibility in the selection of resistance-area product (RA) and lateral dimensions of the magnetic tunnel junction. A high TMR is highly desirable as it enables high easier sensing between the two states, while flexibility in RA design with lateral size enables scalability, as well as improving reliability.

SUMMARY OF THE INVENTION

Briefly, a multi-state low-current-switching magnetic memory element (magnetic memory element) using domain wall positioning to define the memory state is disclosed. The magnetic memory element comprises a substantially flat, elongated free layer, with stacks disposed on each end. The stacks serve both as electrodes, and, due to each having a unique magnetic moment, pin each end of the free layer in opposite magnetic directions. The pinned magnetic moments generate a well-defined domain wall within the free layer. Disposed central to the free layer is a magnetic tunnel junction (MTJ). Current may be passed between the stacks, in either direction, to push the free layer's domain wall in the same direction as electron current is passed, and relocates the domain wall accordingly. Current may also be passed between a stack and the MTJ, providing a resistance value reading. The resistance value is dependent upon the location of the domain wall relative to the MTJ, therefore allowing the magnetic memory element to "store" various values, dependent upon its magnetic state.

These and other objects and advantages of the present invention will no doubt become apparent to those skilled in the art after having read the following detailed description of the preferred embodiments illustrated in the several figures of the drawing.

IN THE DRAWINGS

Figure 2:
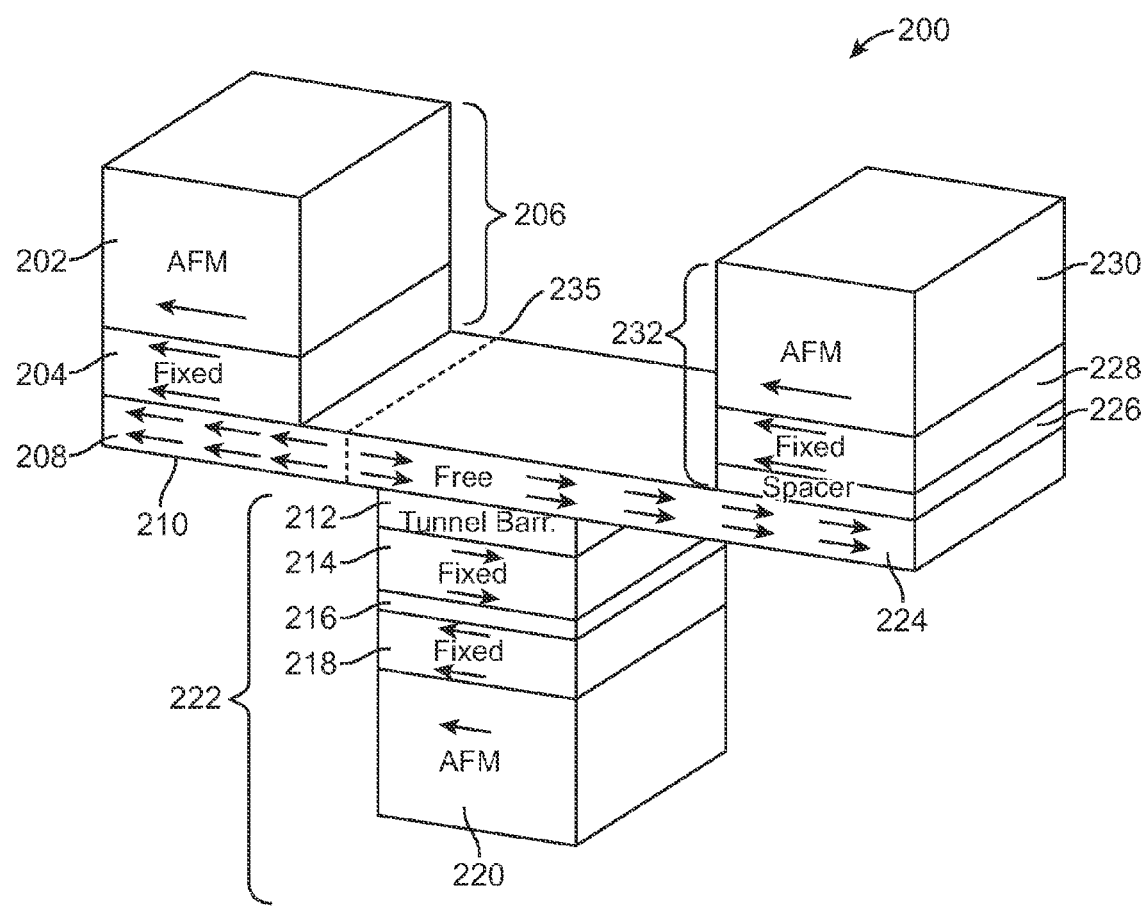
FIG. 2 shows a three-dimensional perspective view of magnetic memory element 200.
Figure 3:
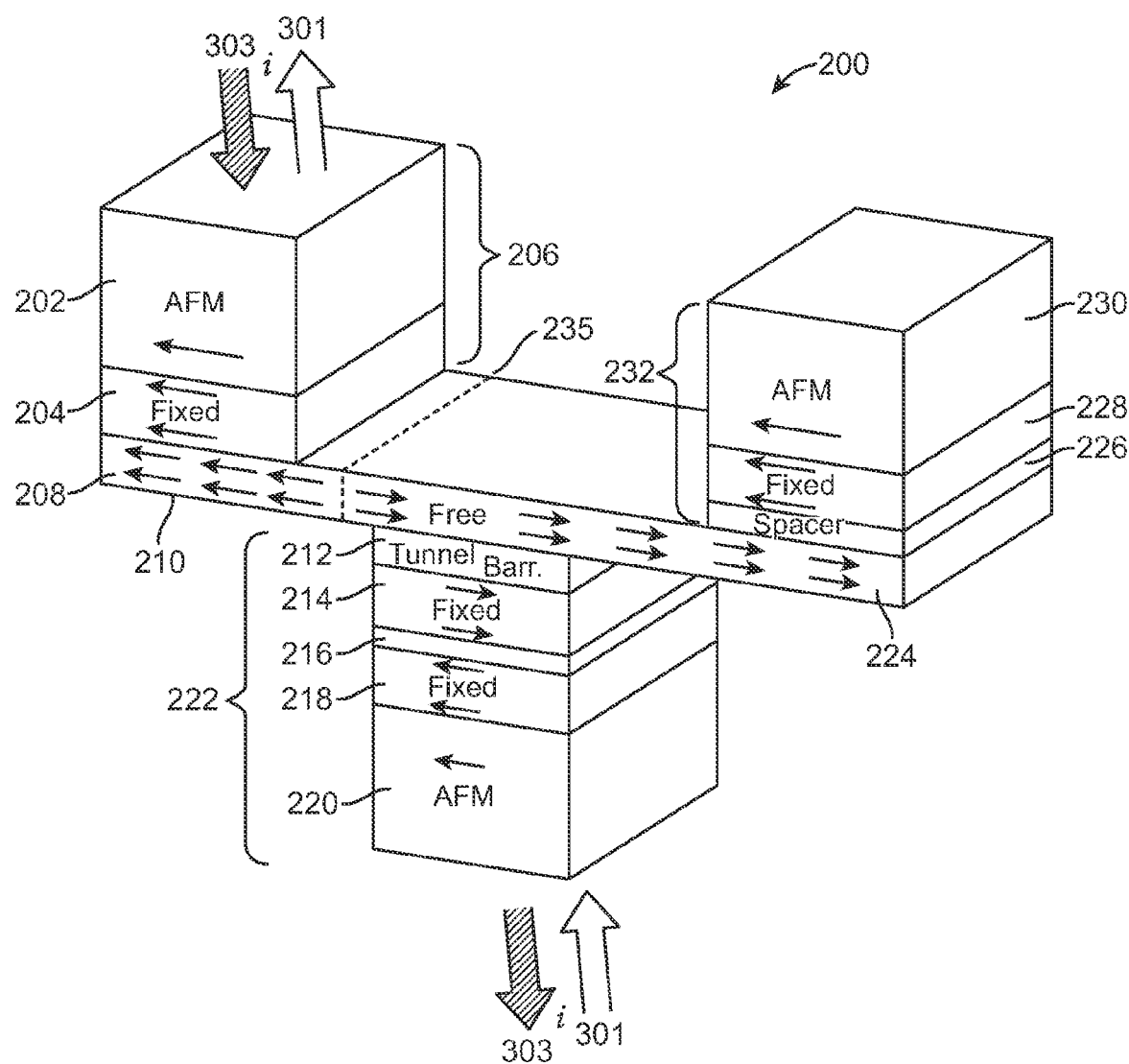

FIG. 3 shows a three-dimensional perspective view of the magnetic memory element of FIG. 2, being read by electron current 303 passed from the left electrode 206 to the magnetic tunnel junction 222.

Figure 4:
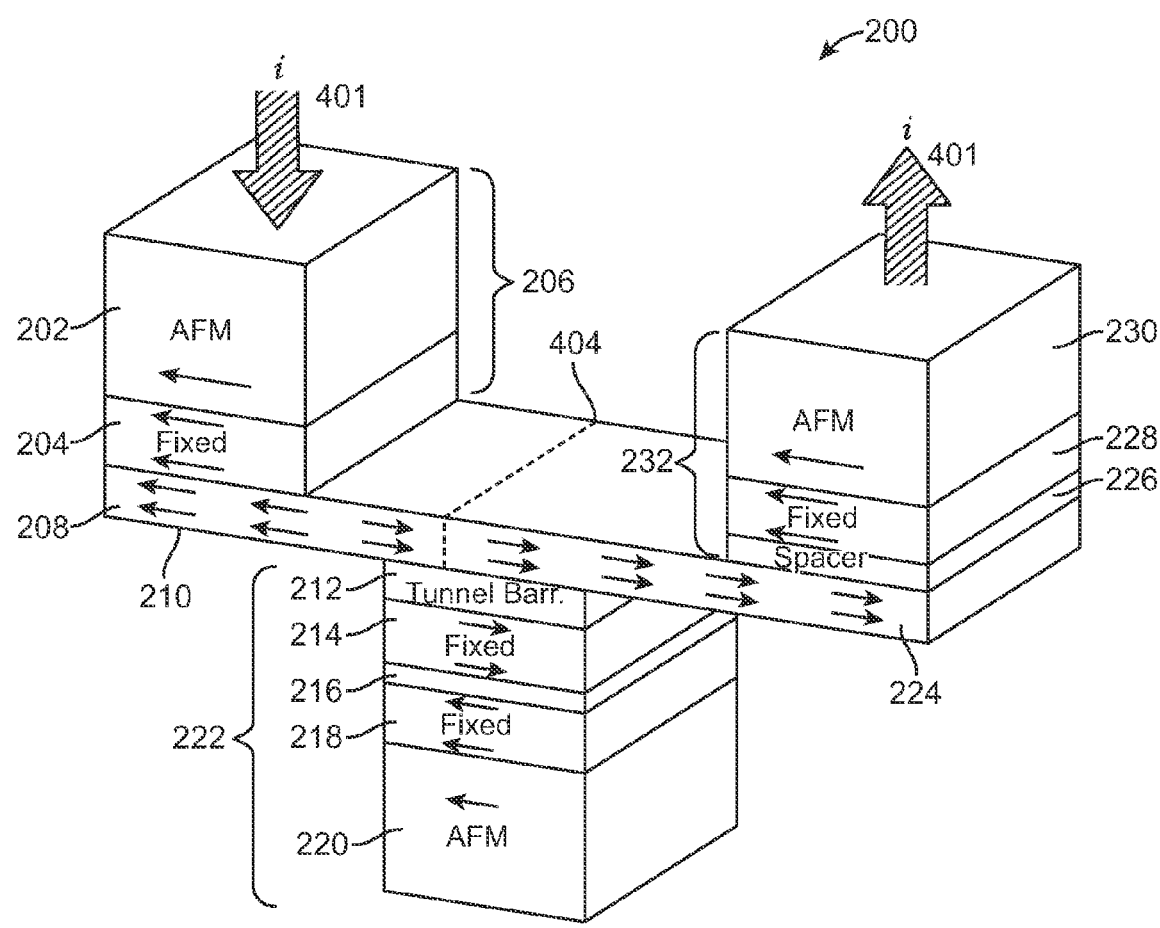

FIG. 4 shows a three-dimensional perspective view of the magnetic memory element of FIG. 2, being written by electron current 401 passed from the left electrode 206 to the right electrode 232.

Figure 5:
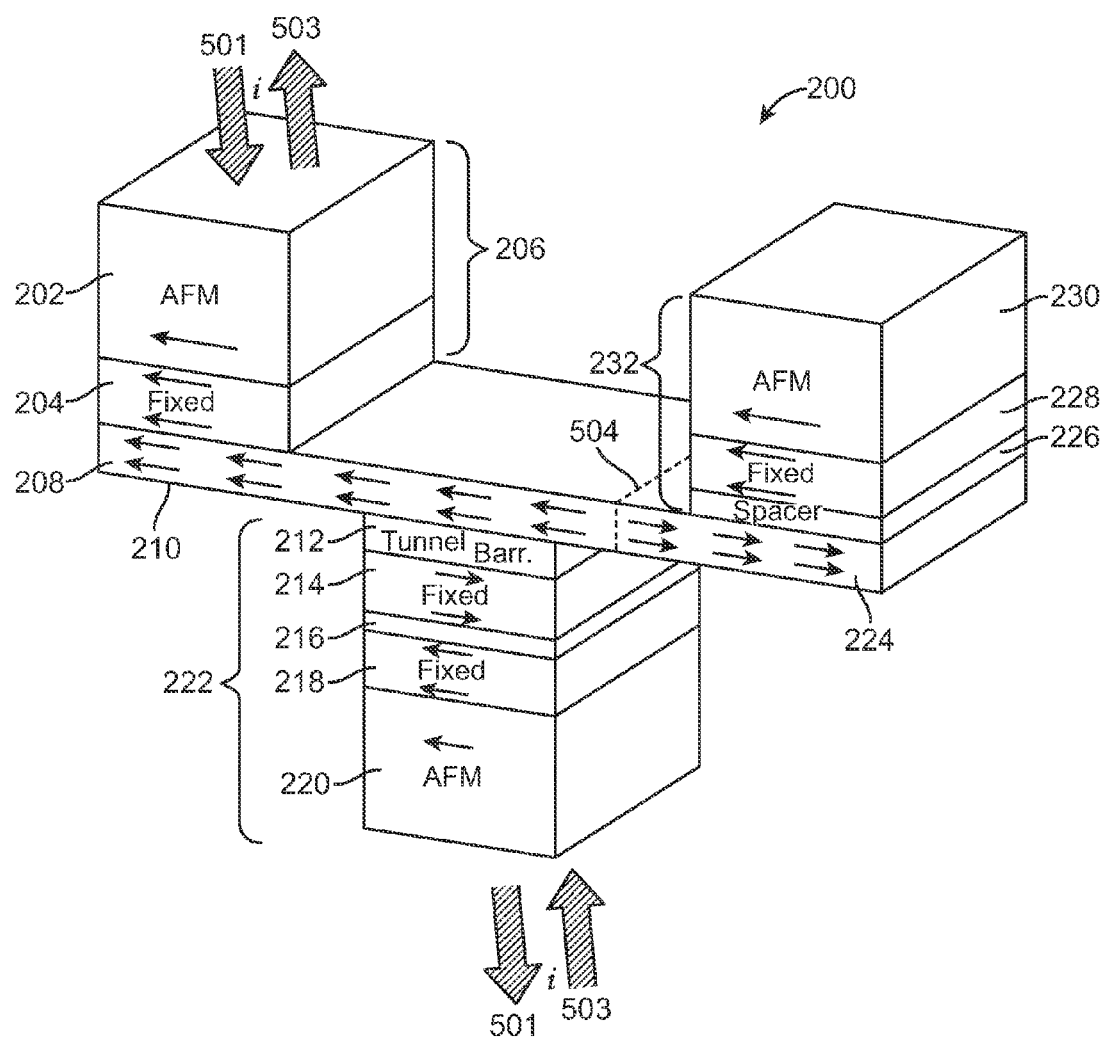

FIG. 5 shows a three-dimensional perspective view of the magnetic memory element of FIG. 2, being read by electron current 501 passed from the left electrode 206 to the magnetic tunnel junction 222.

Figure 6:
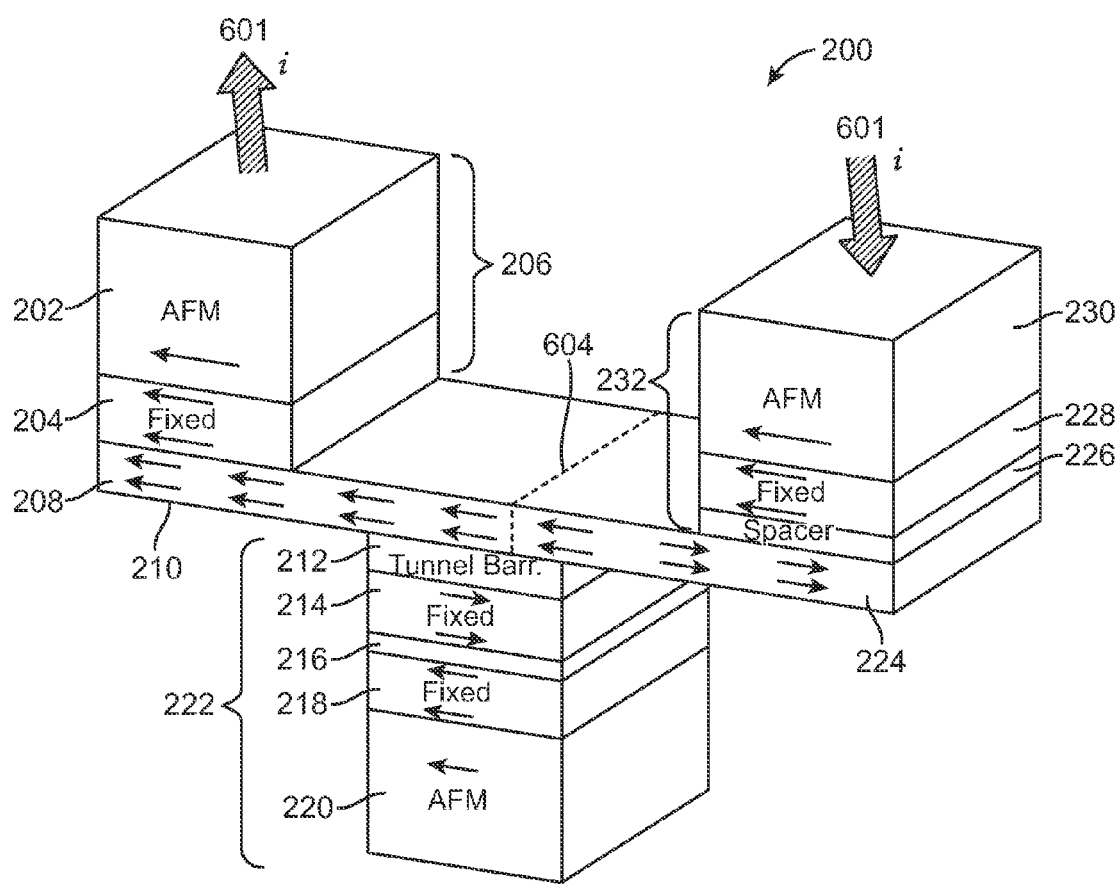

FIG. 6 shows a three-dimensional perspective view of the magnetic memory element of FIG. 2, being written by electron current 601 passed from the right electrode 232 to the left electrode 206.

Figure 7:
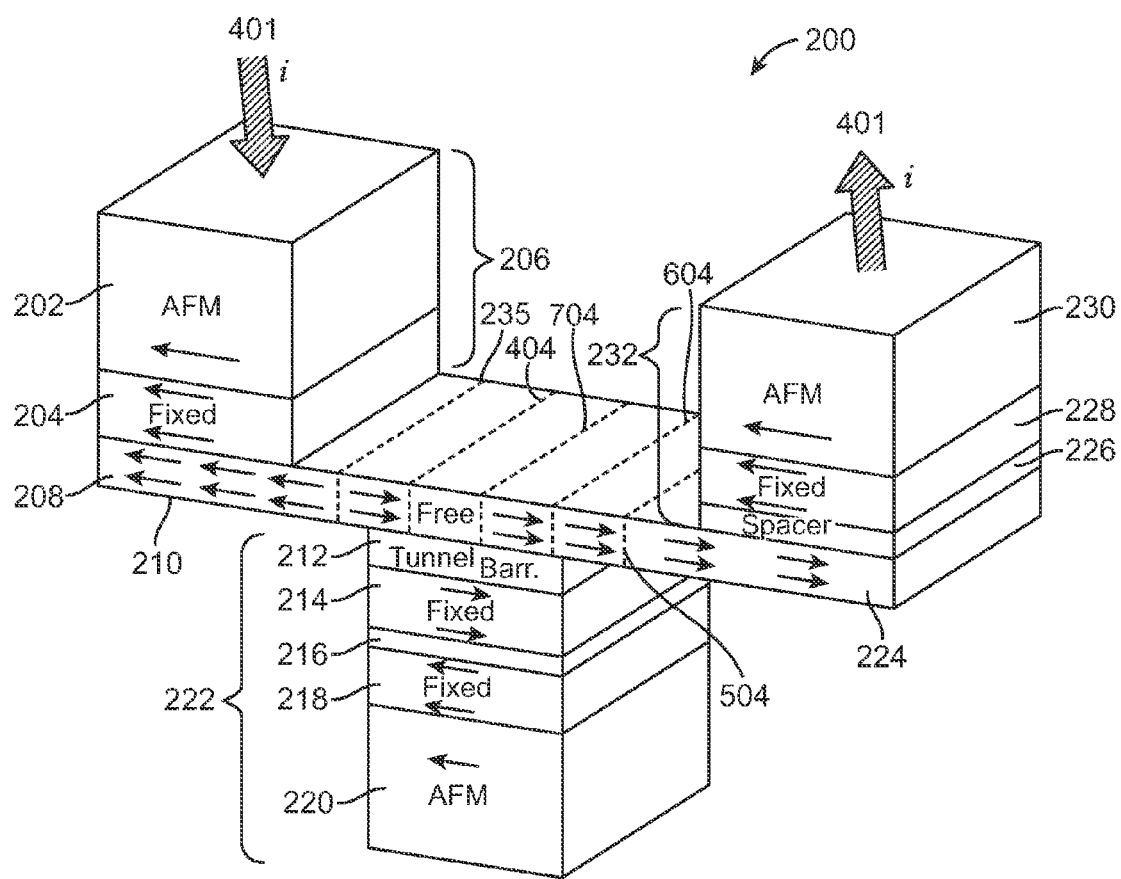

FIG. 7 shows a three-dimensional perspective view of the magnetic memory element of FIG. 2, capable of multi-level storage by inducing multiple domain wall pinning sites.

Figure 8:
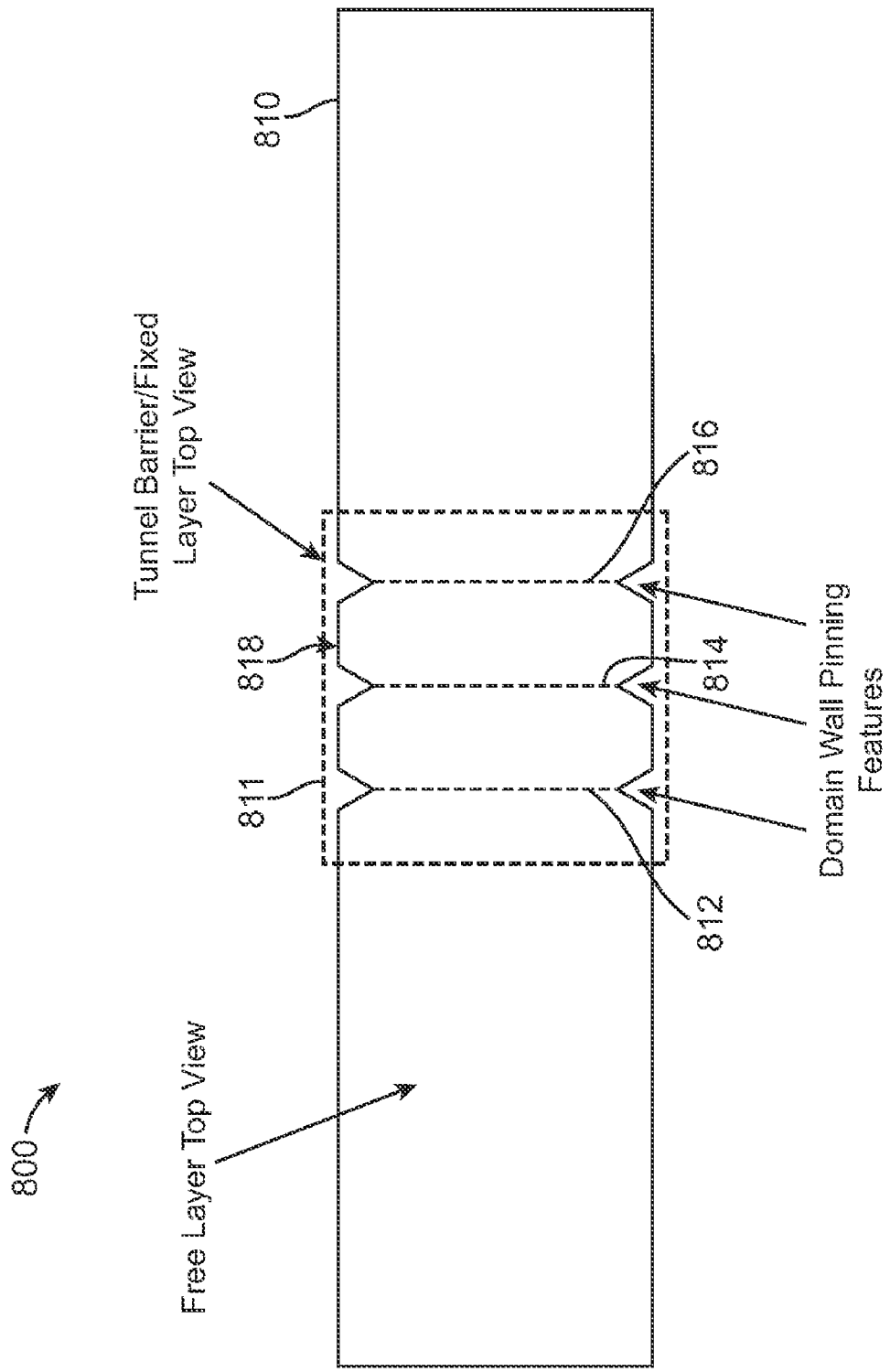

FIG. 8 shows a top view of a notched free layer, capable of multi-level storage due to multiple domain wall pinning sites.

Figure 9:
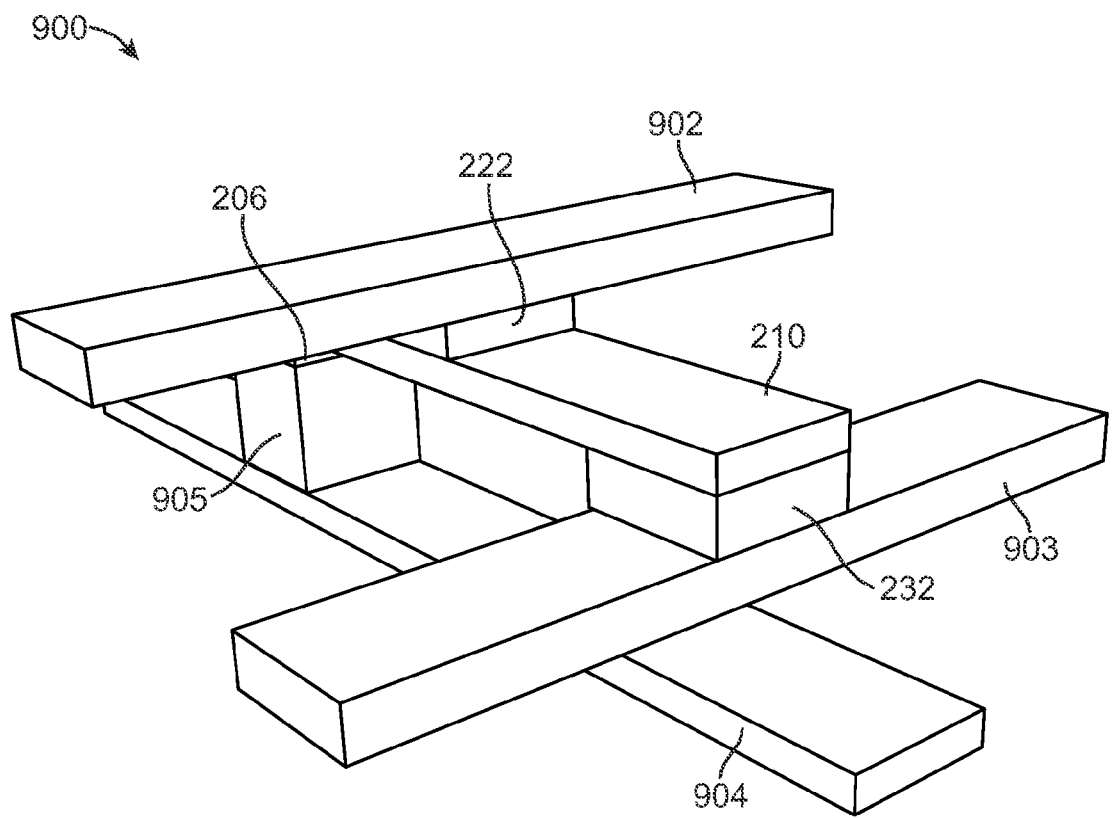

FIG. 9 shows a three-dimensional perspective view of a magnetic memory element arranged with respect to word line and bit line in a memory array assembly.

Figure 10:
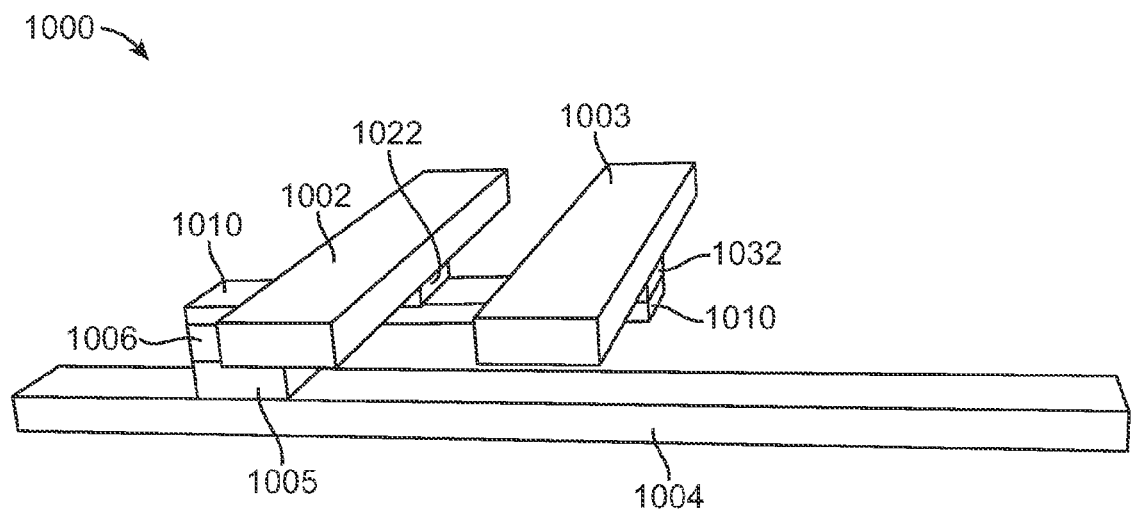

FIG. 10 shows a three-dimensional perspective view of an alternative magnetic memory element arrangement with respect to the bit lines and word line in a memory array assembly.

Figure 11:
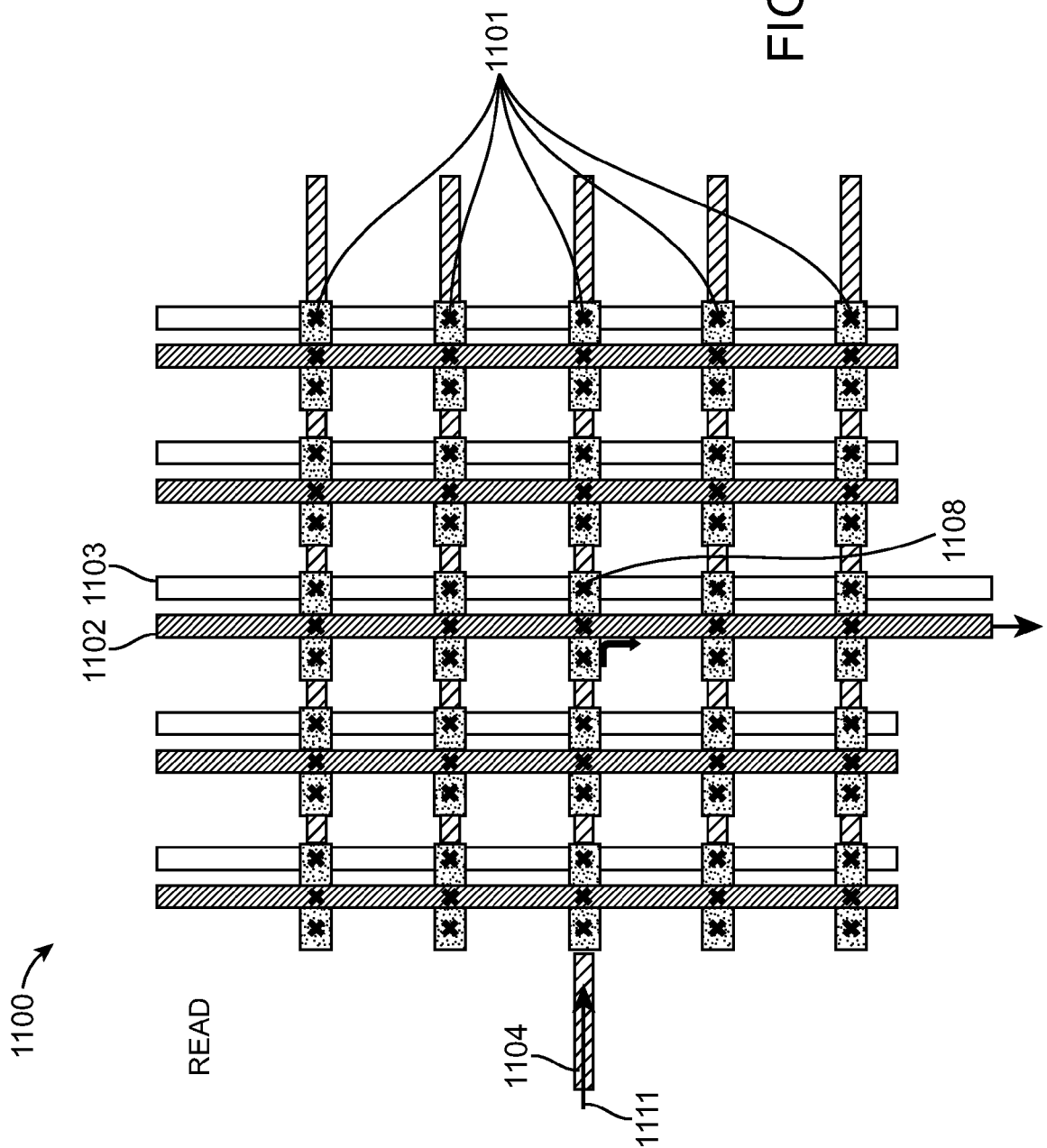

FIG. 11 shows the electron flow, through a magnetic memory element array assembly, for reading the state of a magnetic memory element.

Figure 12:
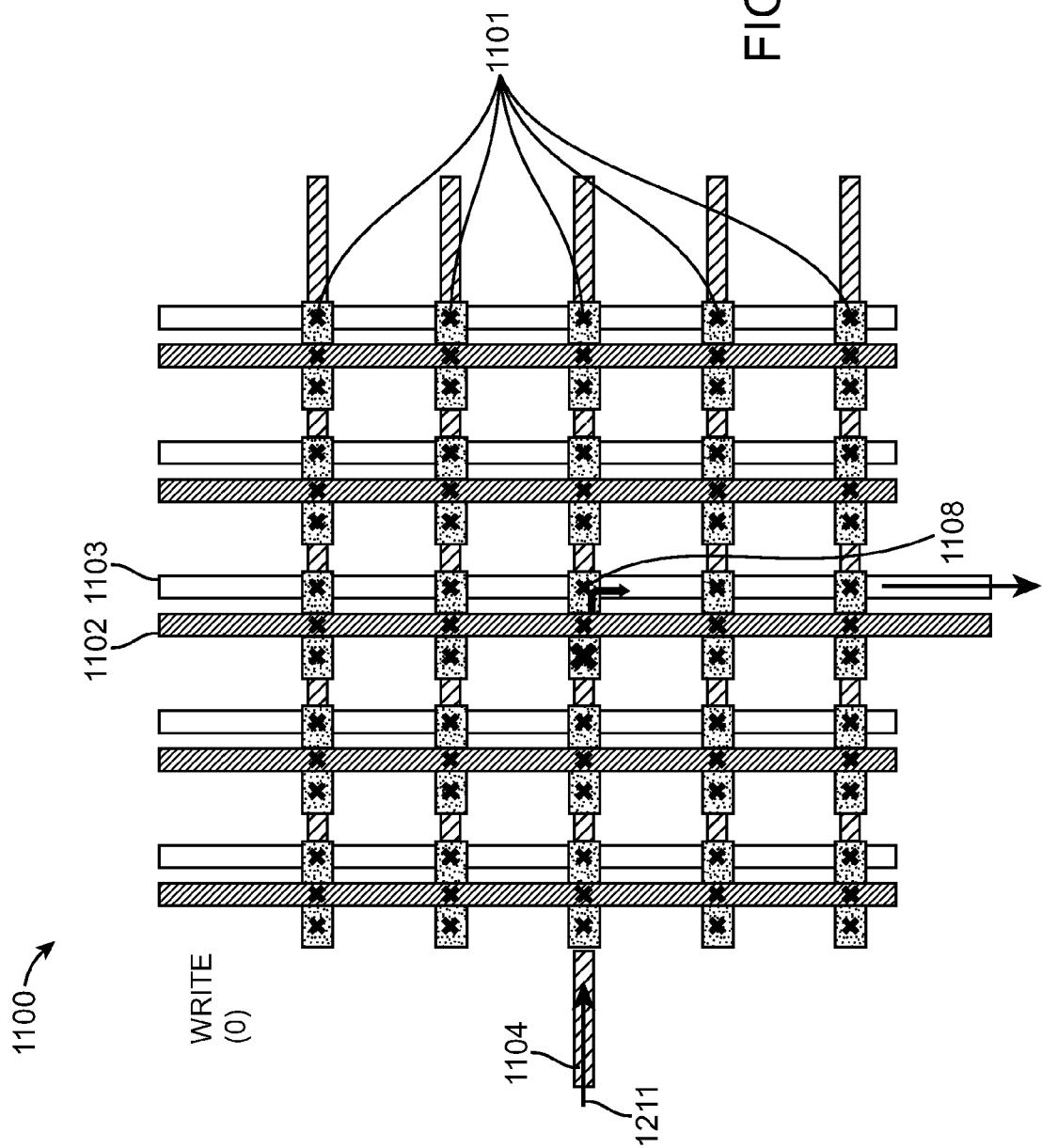

FIG. 12 shows the electron flow, through a magnetic memory element array assembly, for writing a '0' state to a magnetic memory element.

Figure 13:
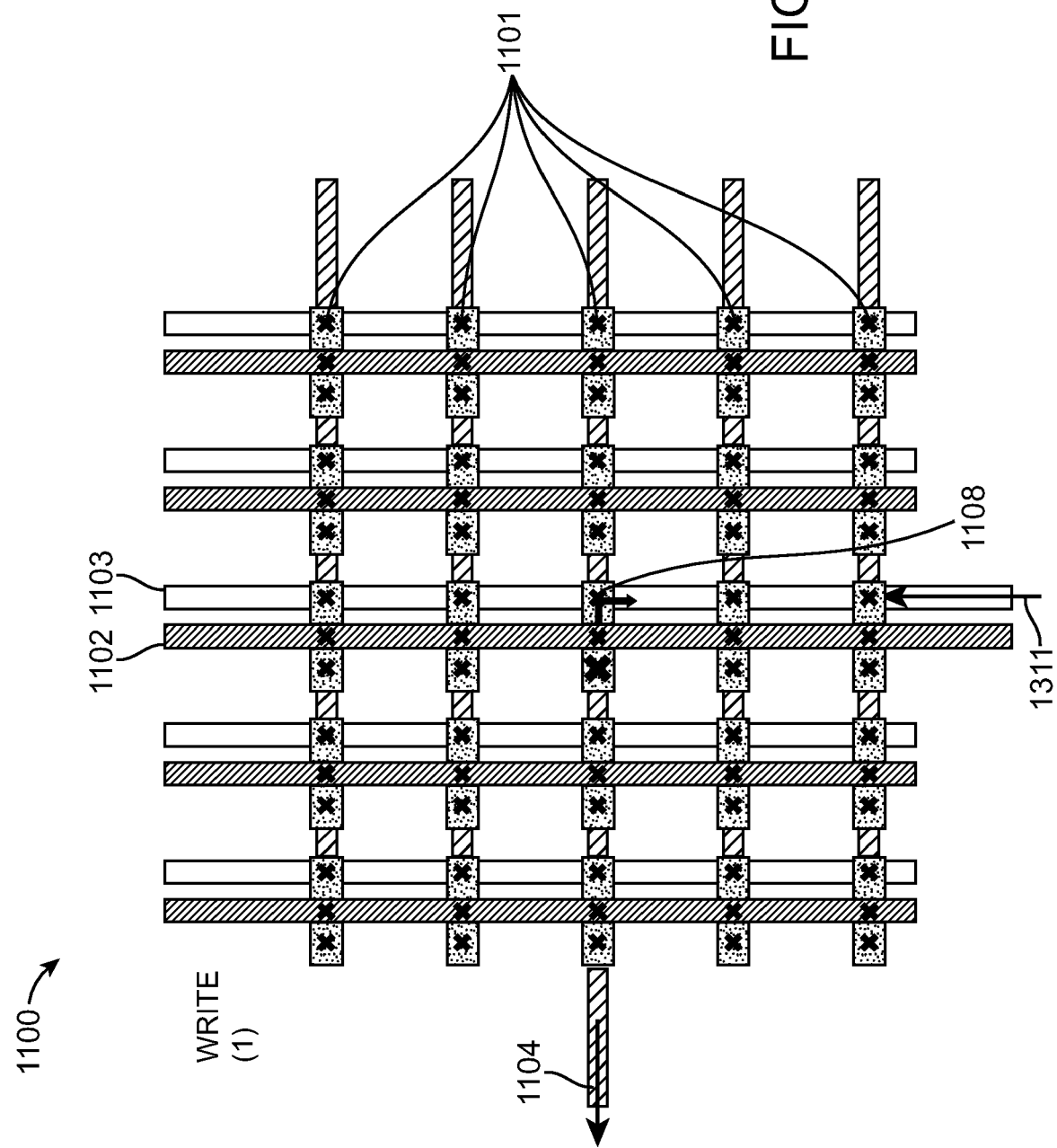

FIG. 13 shows the electron flow, through a magnetic memory element array assembly, for writing a '1' state to a magnetic memory element.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention a magnetic tunnel junction (MTJ) is located central to a free layer, with the free layer having stacks with pinned magnetic moments on either end, and the end-defining stacks creating a well defined magnetic domain state of the free layer therebetween. Pushing the free layer's domain wall towards either stack modifies the domain state of the free layer. The domain wall is pushed by the passage of electron current from a stack, laterally through the free layer, to the other stack. As electron current flows laterally through the free layer, the domain wall is pushed in the direction of the electron flow due to spin transfer torque that exists between the polarized electron spin and the magnetic spins in the domain wall which are not aligned with the electron spins.

Depending on the direction in which electron current is applied, the domain wall can be pushed towards either stack. As a result, the domain wall can be dynamically positioned along the free layer between the stacks. Located on a lateral face of the connecting free layer region is a MTJ. The domain wall can be positioned within the free layer on either side of the MTJ, or anywhere therebetween. In addition to passing current from stack to stack, current can be passed from a stack, through the free layer, to the MTJ; or from the MTJ, through the free layer, to a stack. The MTJ's resistance to electron flow is a function of the domain wall's position within the free layer, and relative to the MTJ. Consequently, the MTJ's resistance to current allows for an accurate measurement of the domain wall's position, and thus allows for storage of a bit (by positioning of the domain wall), and reading of that bit (by reading the MTJ's resistance).

A key to the present invention is the creation of a well-defined domain wall by pinning magnetic moments at either end of the free layer. In one embodiment of the present invention a fixed layer, pinned by an anti-ferromagnetic layer, is located each end of the free layer. One of these fixed layers pins the spins of the free layer in a first direction, and the other fixed layer pins the spins of the free layer at the other end in a second, the opposite, direction. This is shown in FIGS. 2-7, and discussed in further detail below.

Figure 1:
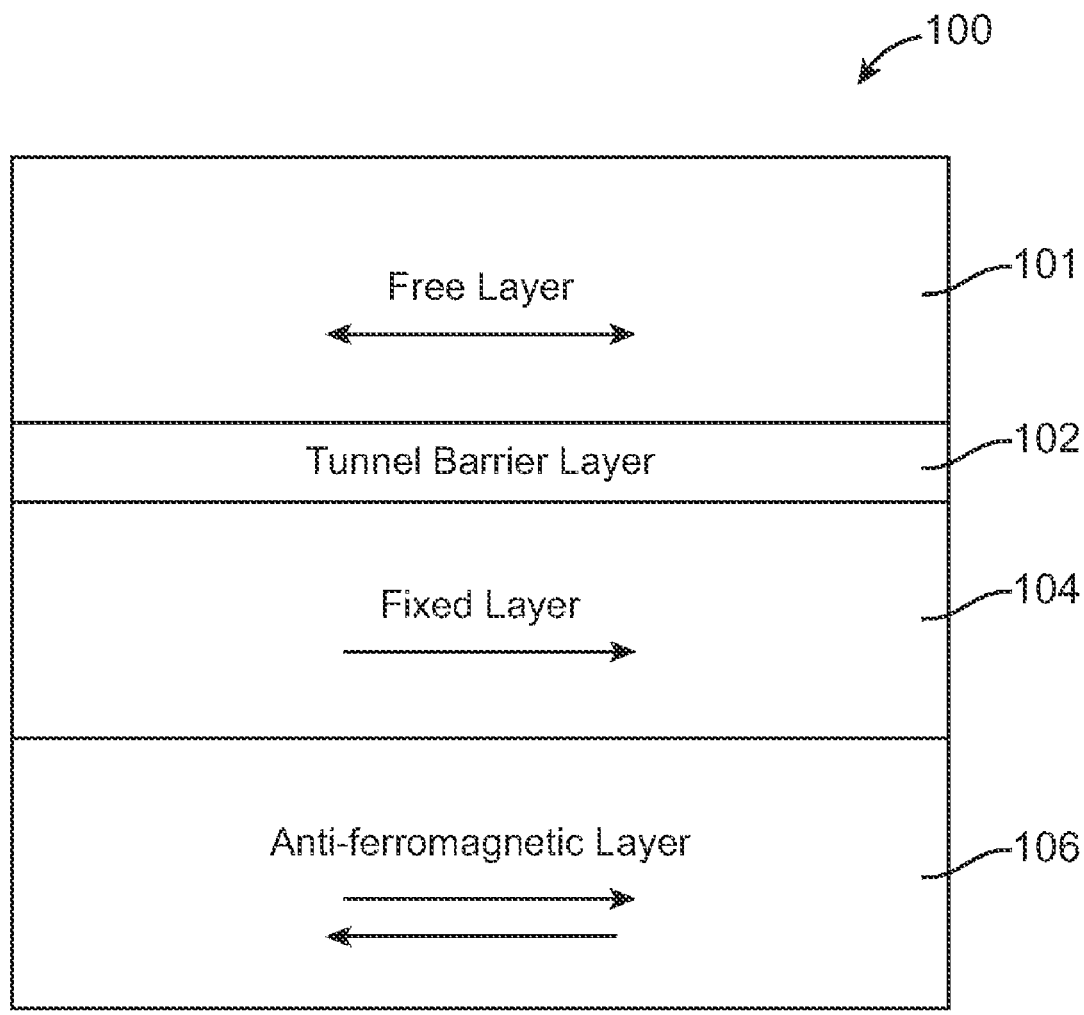
FIG. 1 shows the relevant layers of a magnetic tunnel junction of a magnetic memory element.

Referring now to FIG. 1, stack 100 is shown. Stack 100 is comprises an anti-ferromagnetic layer (AFM layer) 106, a fixed layer 104, a tunnel barrier layer 102, and a free layer 101. Stack 100 is manufactured in such a manner that fixed layer 104 is formed upon AFM layer 106, tunnel barrier layer 102 is formed upon fixed layer 104, and free layer 101 is formed upon tunnel barrier layer 102. Free layer 101, tunnel barrier layer 102, fixed layer 104, and AFM layer 106 are formed directly upon each other with no intermediate layers, and share the same width and depth of less than 500 nm, but mainly limited by the lithography technology being used to pattern the stack. Free layer 101 has a thickness of about 2.5-3 nm; tunnel barrier layer has a thickness of about 1.25 nm; fixed layer 104 has a thickness of about 2.5 nm; and AFM layer 106 has a thickness of about 7 nm.

The composition of AFM layer 106 is typically alloys of IrMn or PtMn. Fixed layer 104 is a compound of Co, Fe, and may contain one or more of the elements from the following list: B, P, Ni, Cr, Ta, Zr, Si, Cr, Mo, Hf, and/or W. The composition of tunnel barrier layer 102 is chosen from: $TiO_2$, $Al_2O_3$, MgO, $Ta_2O_5$, $HfO_2$, $ZrO_2$, TaN, SrO, RuO, and ZnO; and is preferably MgO, or MgO combined with less than 50 molar % of any of the previously listed compounds. Free layer 101 is preferably made of magnetic materials which have weakly exchange coupled grains; such as one, or more than one, of ferromagnetic elements Co, Fe, and Ni, and contains less than 20 atomic % of platinum (Pt). Free layer 101 may also contain up to 20 atomic % of one or more of: P, B, Cr, Ta, W, Mo, Zr, and/or Hf. AFM layer 106, fixed layer 104, tunnel barrier layer 102, and free layer 101 are formed using the same processes used to form the anti-ferromagnetic (AFM) layer, fixed layer, tunnel barrier layer, and free layer, respectively, of U.S. patent application Ser. No. 11/674,124, entitled "Non-Uniform Switching Based Non-Volatile Magnetic Base Memory," filed Feb. 12, 2007, by Ranjan, et al.; U.S. patent application Ser. No. 11/678,515, entitled "A High Capacity Low Cost Multi-State Magnetic Memory," filed Aug. 23, 2008, by Ranjan, et al.; U.S. patent application Ser. No. 11/776,692, entitled "Non-Volatile Magnetic Memory Element with Graded Layer," filed Jul. 12, 2007, by Ranjan, et al.; U.S. patent application Ser. No. 11/740,861, entitled "High Capacity Low Cost Multi-Stacked Cross-Line Magnetic Memory," filed Apr. 26, 2007, by Ranjan, et al.; and U.S. Provisional Patent Application No. 61/045,582, entitled "Low Power Non-Volatile Magnetic Memory Design," filed Apr. 16, 2008, by Ranjan, et al.

Fixed layer 104 has a magnetic moment direction pinned into a single direction through exchange coupling to adjacent AFM layer 106. The magnetic moment direction of free layer 101 can be changed between the parallel and anti-parallel direction with respect to fixed layer 104. Tunnel barrier layer 102 allows electrons to tunnel between fixed layer 104 and free layer 101. When free layer 101's magnetic moment is parallel with fixed layer 104's magnetic moment, the resistance to electron flow through tunnel barrier layer 102 is lower; and when free layer 101's magnetic moment is anti-parallel with fixed layer 104's magnetic moment, the resistance to electron flow through tunnel barrier layer 102 is higher. This difference in resistance is also known as "tunnel magneto-resistance" or TMR.

The magnetic moments' of the fixed layers of the present invention are set using a magnetic annealing process whereby the magnetic films are exposed to a magnetic field of 4-10 kOe, applied in-plane of the wafer surface, at a temperature usually over 350° C. In one embodiment of the present invention, a magnetic field of 10 kOe is applied, in-plane of the wafer surface, at 360° C. for 2 hours. In other embodiments of the present invention the field exposure time may be shorter, for as short as a few minutes, or longer. The annealing process causes re-crystallization of the free and fixed layers adjacent to the MgO tunnel barrier layer. This step is critical, as it ensures a high TMR, and impacts the read-speed of the final memory.

Referring now to FIG. 2, magnetic memory element 200 is shown. Magnetic memory element 200 is comprised generally to have a free layer 210, having stacks 206 and 232 positioned on opposite ends of a lateral surface of free layer 210, and MTJ 222 positioned centrally on a lateral surface of free layer 210. In FIG. 2, stacks 206 and 232 are shown positioned on a top surface, while MTJ 222 is positioned on a bottom surface of magnetic memory element 200. Stacks 206, 232, MTJ 222, and free layer 210 all have substantially the same depth, less than 500 nm, but mainly limited by the lithography technology being used to pattern the stack.

In an alternative embodiment of the present invention, one or both stacks are positioned on the same free layer 210 surface as MTJ 222 is. This would be the bottom surface of free layer 210 in FIGS. 2-7. Thus, stacks 206 and/or 232 could extend from the same surface of free layer 210, or from opposite surfaces of each other. For example, stack 206 might extend from the top surface of free layer 210 while MTJ 222 and stack 232 extend from the bottom surface of free layer 210; or both stacks 206 and 232 extend from the bottom surface with MTJ 222. The reference to a "top surface" or a "bottom surface" of free layer 210 is used strictly in reference to drawings, to assist in orientation, and "surfaces" refers to the flat lateral sides of free layer 210 with the greatest surface area. The top surface is so called because it is closer to the top of the page as viewed in FIGS. 2-7, while the bottom surface of free layer 210, hidden underneath and not visible due to the perspective view, is closer to the bottom of the page.

Stack 206 comprises AFM layer 202 formed upon fixed layer 204, and fixed layer 204 is formed upon free layer 210. The layers of stack 206 have substantially the same depth and width, forming a generally uniform raised structure. Stack 232 comprises AFM layer 230 formed upon fixed layer 228, which is formed upon spacer layer 226, and spacer layer 226 is formed upon free layer 210. The layers of stack 232 have substantially the same depth and width, forming a generally uniform raised structure.

AFM layers 202 and 230 pin the directions of the magnetic moments of fixed layers 204 and 228, respectively. AFM layers 202 and 230 are formed by the same process, and share the same properties, as AFM layer 106. Fixed layers 204 and 228 are formed by the same process, and share the same properties, as fixed layer 104. Spacer layer 226 comprises a thin layer of Ru, typically 0.8-1 nm thick. Spacer layer 226 reverses the effective magnetic exchange coupling between fixed layer 228 to free layer 210. This is necessary because the magnetic annealing of a wafer is a global process affecting the whole wafer, aligning the magnetic moments of all of the AFM layers (202, 230, and 220), and consequently pinning the magnetic moments of fixed layers adjacent to the AFM layers—fixed layers 204, 226, and 218, respectively—in the same direction. In order to create a well-defined domain wall 235 within free layer 210, the magnetic moments of stacks at each end of free layer 210 (stacks 206 and 232) should have magnetic moments anti-parallel to each other.

Free layer 210 is shown to have two domains, anti-parallel domain 208 and parallel domain 224, anti-parallel domain 208 and parallel domain 224 being separated by domain wall 235. Domain wall 235 is an interface or transition between the parallel magnetic field of parallel domain 224 and the anti-parallel magnetic field of anti-parallel domain 208. "Parallel" and "anti-parallel" are used in reference to MTJ 222. As shown in FIGS. 2-7, the magnetic moment of parallel domain 224 is designated by arrows pointing to the right, in the same direction as the magnetic moment of fixed layer 214 of MTJ 222. Anti-parallel domain 208's magnetic moment is designated by arrows pointing to the left, which is anti-parallel to the magnetic moment of fixed layer 214 of MTJ 222. Domain wall 235 spans a distance of about 100-150 atoms.

In the following disclosures and figures, the free layers (e.g. free layer 210) are referred to and depicted as being rectangular, with four flat lateral sides and 2 flat ends. Further, two of the lateral sides are depicted as having significantly greater surface area than the other two lateral sides, the two lateral sides with the greater surface area being referred to as the "top surface and "bottom" surface of the free layers. This thin, flat, but deep conformation lends itself to a simplified manufacturing process, reduces the cross-sectional area, and better defines the free layer's domain wall, but other conformations are considered. Other conformations may include a free layer having four lateral sides of all the same size (square extruded), or triangular extruded, or any other geometric shape where a well-defined domain wall can be maintained within.

MTJ 222 is formed on a lateral surface of free layer 210, substantially central to the surface, and may be on a lateral side opposite of stacks 206 and 232, and. MTJ 222 comprises a tunnel barrier layer 212, fixed layers 214 and 218, spacer layer 216, and AFM layer 220. MTJ 222 is formed upon the lateral surface of free layer 210, upon which is formed fixed layer 214, upon which is formed spacer layer 216, upon which is formed fixed layer 218, and upon which is formed AFM layer 220. The two fixed layers 214 and 218 have opposite magnetic moments (also known as a "synthetic anti-ferromagnet") which reduces the magneto-static interaction between the fixed layers and free layer 210. The MTJ 222 have substantially the same depth and width, forming a generally uniform raised structure off of a free layer 210 lateral surface.

Free layer 210 is made of weakly exchange coupled magnetic materials. This allows for the magnetic domains 208 and 224 to be more easily shrunken and enlarged. Free layer 210 carries the spin transfer current from stack-to-stack, or stack-to-MTJ. The cross sectional area of free layer 210 can be made very small, especially compared to the lateral dimensions of the free layer 210 or the MTJ 222, making domain wall 235 amenable to movement by the passage of a low current.

Tunnel barrier layer 212 is a non-conducting crystalline layer that allows the passage of electrons from free layer 210 to fixed layer 214, or in the opposite direction, from fixed layer 214 to free layer 210 through tunneling. Tunnel barrier layer 212 is identical to tunnel barrier layer 102 in function, composition, and thickness, as described in detail above.

In FIG. 2, as indicated by the arrows in free layer 210, domain wall 235 is closer to stack 206 (located within free layer 210 between stack 206 and MTJ 222), and thus parallel domain 224 of free layer 210 is adjacent to tunnel barrier layer 212. As explained above parallel domain 224's magnetic moment is anti-parallel to the magnetic moments of fixed layers 204 and 228, but is parallel to that of fixed layer 214. When parallel domain 224 of free layer 210 is located adjacent to tunnel barrier layer 212 the resistance experienced by any current passing through to, or from, MTJ 222 is less than the resistance experienced when domain wall 235 is pushed to the other side of MTJ 222, and anti-parallel domain 208 is located adjacent to tunnel barrier layer 212.

The conducting spacer layer 216 is identical to spacer layer 226 in function, and possible composition and thickness, as described above in detail. Spacer layer 216 is located in between fixed layers 218 and 214 and inverts the magnetic exchange coupling between fixed layers 218 and 214. Consequently, the magnetic moment of fixed layer 214 is anti-parallel to the magnetic moments of all other fixed layers (204, 228, 218) in magnetic memory element 200.

Referring now to FIG. 3, the memory state of magnetic memory element 200 is being read. The magnetic state of memory element 200 is read by passing either current 303 or current 301 through magnetic memory element 200. Current 303 is applied at AFM layer 202 of stack 206, passes through stack 206, into and laterally through free layer 210, and then out MTJ 222 through AFM layer 220. Current 301 is applied at AFM layer 220 of MTJ 222, passes through MTJ 222, into and through free layer 210, and then out of stack 206 through AFM layer 202. When domain wall 235 is positioned such that parallel domain 224 is adjacent to tunnel barrier layer 212, the electron spin orientations in free layer 210 and fixed layer 214 are parallel, and currents 301 and/or 303 experience a low resistance state. Alternatively, the magnetic state of memory element 200 can be read by passing the current through stack 232 instead of stack 206.

In FIG. 4, the memory state of magnetic memory element 200 is being written. Electron current 401 is applied at AFM layer 202 of stack 206, passes through stack 206, into and laterally through free layer 210, and then out of stack 232 through AFM layer 230. As electron current 401 passed through free layer 401, it pushes domain wall 404 to the right, towards stack 232. Domain wall 404, as shown, is one possible position of the domain wall within free layer 210 as it is pushed from stack 206, towards stack 232, and is a repositioned domain wall 235.

Referring now to FIG. 5, the memory state of magnetic memory element 200 is again being read. In FIG. 5, current passed from stack 206 to stack 232 (shown in FIG. 4 as current 401) has moved domain wall 504 to the other side of MTJ 222. In this state, domain wall 504 is between MTJ 222 and stack 232, and anti-parallel domain 208 of free layer 210 is now adjacent to, and interfaced with, tunnel barrier layer 212. To read the memory state of magnetic memory element 200, either current 501 or current 503 is passed through magnetic memory element 200. Current 501 is applied to AFM layer 202 of stack 206, passes through stack 206, into and laterally through free layer 210, and then through MTJ 222, out through AFM layer 220. Current 503 is applied to AFM layer 220 of MTJ 222, passes through MTJ 222, into and laterally through free layer 210, and then through stack 206, out through AFM layer 202. Alternatively, the magnetic state of memory element 200 can be read by passing the current through stack 232 instead of stack 206.

When domain wall 504 is positioned so that anti-parallel domain 208 is adjacent to tunnel barrier layer 212, the magnetic spin orientations of adjacent free layer 210 and neighboring fixed layer 214 are anti-parallel, and currents 501 and/or 503 experience a high resistance state. This high resistance state, experienced by currents 501 and 503 when passing from anti-parallel domain 208 through tunnel barrier layer 212 to fixed layer 214, is higher than the resistance experienced by currents 301 and 303 when passing through parallel domain 224, tunnel barrier layer 212, and fixed layer 214. Because these different resistance states are a direct function of the positioning of the domain wall (domain walls 235 and 504 within FIGS. 2-5), the domain wall positioning effectively represents either a '0' or a '1' state of magnetic memory element 200.

In FIG. 6, the memory state of magnetic memory element 200 is again being written. Electron current 601 is applied at AFM layer 230 of stack 232, passes through stack 232, into and laterally through free layer 210, and then out of stack 206 through AFM layer 202. Electron current 601 pushes domain wall 604 to the left, towards stack 206. Domain wall 604, as shown, is one possible position of the domain wall within free layer 210 as it is pushed from stack 232, towards stack 206.

Eventually, domain wall 604 will be returned to domain wall 235 in the position shown in FIG. 2, and consequently magnetic memory element 200 will be returned to the associated state.

The currents 301, 303, 501 and 503 typically have a much smaller magnitude than the current 401 and 601. The magnitude of currents 301, 303, 501, and 503 is reduced in order to prevent domain wall motion during the read out process.

Referring now to FIG. 7, in alternative embodiments of the present invention, memory element 200 may be capable of storing more than 2 memory states, i.e., more than just '0' or '1'. This is possible by using electron currents 401 and 601 to relocate the domain wall of free layer 410 to more than two positions. In these alternative embodiments, the domain wall within free layer 410 may be positioned where domain walls 404 and 604 are depicted positioned previously, as well as other positions. In FIGS. 4 and 6, respectively, domain walls 404 and 604 are positioned such that tunnel barrier layer is adjacent to areas of anti-parallel domain 208 and parallel domain 224 concurrently. This sub-division of memory states is possible by applying an electron pulse (current) that pushes the domain wall only a limited distance. When the domain wall is in these intermediate positions, resistance values between the previously described high resistance and low resistance states are obtained.

As shown in FIG. 7, domain wall 404 is positioned in a manner that makes a larger area of parallel domain 224 adjacent/interfaced to tunnel barrier layer 212 than anti-parallel domain 208. Domain wall 704 is positioned in a manner that makes equal areas of anti-parallel domain 208 and parallel domain 224 adjacent/interfaced to tunnel barrier layer 212. Domain wall 604 is positioned in a manner that makes a larger area of anti-parallel domain 208 adjacent/interfaced to tunnel barrier layer 212 than parallel domain 224.

The resistance of MTJ 222 is a function of the surface areas of parallel domain 224 and of anti-parallel domain 208 that are interfaced with tunnel barrier layer 212. The resistance to current decreases as tunnel barrier layer 212 is interfaced with a greater surface area of parallel domain 224, and lesser area of anti-parallel domain 208. And, conversely, the resistance to current increases as tunnel barrier layer 212 is interfaced with a greater surface area of anti-parallel domain 208, and lesser area of parallel domain 224. Thus, a read operation of magnetic memory element 200 with domain wall 404 would experience less resistance than a read operation of magnetic memory element 200 with domain wall 704. A read operation of magnetic memory element 200 with domain wall 604 would have a greater resistance than domain walls 404 or 704. All of these resistance values would be between the high resistance state (domain wall 235) and low resistance state (domain wall 504), shown in FIGS. 2 and 5 respectively.

Referring to FIG. 8, another method of achieving multiple levels of memory states is shown, in an alternative embodiment of the present invention. In FIG. 8, a top view of free layer 810 of magnetic memory element 800 is shown. Central to the bottom surface of free layer 810, hidden below notch region 811 and not visible in FIG. 8, is an MTJ, MTJ 818, comprised of the same layers as MTJ 222 of magnetic memory element 200. The notches 812, 814, and 816 in free layer 810 all correspond to a preferred domain wall position. At notches 812, 814, and 816, the cross-sectional area of free layer 810 is at a minimum, and thus the domain wall thickness is reduced, and better defined. As the domain wall is pushed to the narrowest part of each notch, it accelerates, due to the decreasing cross-sectional surface area; and as the domain wall is pushed out of a notch, it does so slowly, due to the increasing cross-sectional surface area. As with memory element 200, each notch position is associated with a different resistance, with resistance increasing as a larger region of anti-parallel magnetic domain interfaces with the tunnel barrier layer of MTJ 818. This creates an effective way to "lock" the domain wall in consistent positions, and thus makes multi-level storage more reliable.

Referring now to FIG. 9, a three-dimensional perspective view of a magnetic memory array 900 is shown in one embodiment of the present invention. Magnetic memory array includes magnetic memory element 200, with MTJ 222, free layer 210, and stacks 232 and 206 labeled appropriately. On AFM layer 230 of MTJ 222, bit line read 902 is coupled; on AFM layer 230 of stack 232, bit line write 903 is coupled; and on AFM layer 202 of stack 206, pinning layer 905 is coupled, which has word line read/write formed thereupon.

Magnetic memory element 200 is inverted, with respect to how it is shown in FIGS. 2-7, so that MTJ 222 extends upward from free layer 210, and stacks 232 and 206 extend downward from free layer 210. Consequently, MTJ 222 is the top-most part of magnetic memory element 200, and bit line read 902, above MTJ 222, is the highest line. Bit line read 902 is parallel to bit line write 903. Bit line write 903 runs below memory element 200, perpendicular to the lengthwise direction of free layer 210. Pinning layer 906 is formed off of AFM layer 230, and pinning layer 906 extends downward, coupled to word line read/write 904. The pinning layer 906 has the same function as pinning layer 204 in FIGS. 2-7. Word line read/write 904 runs parallel to free layer 210, below bit line write 903, and at a distance of the height of pinning layer 905 plus the height of stack 206. An important feature of array 900 is that bit line read 902 and bit line write 903 are in different planes. Bit line read 902 is connected to MTJ 222, as current is only passed through it to read the memory state of the memory element; bit line write 903 is connected to stack 232, as current passes through it only to write the memory state of the memory element; and word line read/write 904 is connected to stack 206, as current passes through it for both reading and writing the memory state of the memory element.

In FIG. 9, to simplify the drawing, only one magnetic memory element is included in array 900, but in practice many magnetic memory elements may be attached to word line read/write 904, bit line write 903, and bit line read 902. This direct connection can be modified to include a select transistor. In such a configuration, the word line is connected to the gate of the transistor, the left side fixed layer is connected to one end of the transistor, and the other end of the transistor can be at low (e.g. ground) or high potential, depending on the direction of the read current and the direction of the write current.

Referring to FIG. 10, a three-dimensional perspective view of magnetic memory array 1000 is shown in an alternative embodiment of the present invention. In this array, the bit line arrangement and the memory element are configured differently than with memory element 200 or array 900. In array 1000, bit line read 1002 and bit line write 1003 are parallel to each other and in the same plane. The magnetic memory element of array 1000 is configured in a manner so that MTJ 1022 and stack 1032 extend off of the same (top) surface of free layer 1010, and stack 1006 extends off of the other (bottom) surface of free layer 1010. Stack 1006 is structurally and functionally identical to stack 206, free layer 1010 is structurally and functionally identical to free layer 210, MTJ 1022 is structurally and functionally identical to MTJ 222, and stack 1032 is structurally and functionally identical to stack 232. The relocation of one of the stacks, stack 1032, to the same surface of free layer 1010 as the MTJ, MTJ 1022, does not cause the magnetic memory element to operate any differently than as discussed above for memory element 200.

As oriented, bit line read 1002 and bit line write 1003 are the top most components, with word line read/write 1004 the bottom most component, and the magnetic memory element sandwiched between. This alternative orientation provides an alternative method of laying out the magnetic memory circuitry.

Referring now to FIGS. 11-13, reading and writing current application to the magnetic memory arrays 900 or 1000 is shown. In FIGS. 11-13, array 1100 is shown consisting of 25 (twenty-five) magnetic memory elements 1101, each having two stacks and an MTJ, and all connected to a word line read/write, bit line read, and bit line write. Of interest is magnetic memory element 1108, connected to word line read/write 1104 at one stack, bit line write 1103 at a second stack, and bit line read 1102 at its MTJ.

In FIG. 11, current 1111 is applied to word line read/write 1104, which travels through magnetic memory element 1108, and out through bit line read 1102. Because word line read/write 1104 is connected to magnetic memory element 1108 at a stack, e.g. stack 206 or 1006, and bit line read 1102 is connected to magnetic memory element 1108's MTJ, e.g., MTJ 222 or 1022, application of current 1111 will provide a resistance value for reading the memory state of magnetic memory element 1108.

In FIG. 12, current 1211 is applied to word line read/write 1104, which travels through magnetic memory element 1108, and out through bit line write 1103. Because word line read/write 1104 is connected to magnetic memory element 1108 at one stack, e.g. stack 206 or 1006, and bit line write 1103 is connected at magnetic memory element 1108's second stack, e.g. stack 232 or 1032, application of 1211 pushes the domain wall within magnetic memory element 1108's free layer towards the second stack connected to bit line write 1103, and writes a '0' value to the magnetic memory element.

In FIG. 13, current 1311 is applied to bit line write 1103, which travels through magnetic memory element 1108, and out through word line read/write 1104. Current 1311 pushes the domain wall of magnetic memory element 1108 in a direction opposite to how it's pushed by current 1211, towards the first stack connected to word line read/write 1104, and consequently a '1' value is written to magnetic memory element 1108.

As known by one of ordinary skill in the art, the present invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, and/or schematic capture levels. Examples of HDLs include, but are not limited to: GDS II and OASIS (layout level); various SPICE languages, and IBIS (circuit netlist level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

Although the present invention has been described in terms of specific embodiment, it is anticipated that alterations and modifications thereof will no doubt become apparent to those more skilled in the art. Such alterations and modifications include, for example, extending the stacks and magnetic tunnel junction from free layer in various three-dimensional conformations, normal to the substrate surface or stacked planes on top, in order to maintain higher capacity. It is therefore intended that the following claims be interpreted as covering all such alterations and modification as fall within the true spirit and scope of the invention.

What is claimed is:

1. A multi-state low-current-switching magnetic memory element comprising:
   a free layer;
   a first stack disposed upon a surface of the free layer;
   a second stack disposed upon a surface of the free layer;
   a magnetic tunneling junction disposed upon the free layer, between the first stack and the second stack;
   wherein the first stack and second stack pin opposing magnetic moments within the free layer, creating two magnetic domains separated by a domain wall within the free layer; and
   the position of the domain wall relative to the magnetic tunneling junction corresponds to different memory states.

2. A multi-state low-current-switching magnetic memory element of claim 1, wherein current passed between the stacks pushes the free layer domain wall.

3. A multi-state low-current-switching magnetic memory element of claim 2, wherein current passed between a stack and the magnetic tunnel junction provides a reading regarding the domain wall position.

4. A multi-state low-current-switching magnetic memory element of claim 3, wherein the reading of the domain wall position is a resistance value.

5. A multi-state low-current-switching magnetic memory element of claim 4, wherein different resistance values correspond to different memory states.

6. A multi-state low-current-switching magnetic memory element of claim 5, wherein the cross-sectional area of the free layer is about 500 nm$^2$ to 25,000 nm$^2$.

* * * * *